(12) United States Patent
Hongo et al.

(10) Patent No.: US 7,098,734 B2
(45) Date of Patent: Aug. 29, 2006

(54) DISTORTION-COMPENSATED AMPLIFIER USING PREDISTORTION TECHNIQUE

(75) Inventors: Naoki Hongo, Tokyo (JP); Tetsuhiko Miyatani, Tokyo (JP); Yoshihiko Akaiwa, Munakata (JP)

(73) Assignee: Hitachi Kokusai Electric Inc., Tokyo (JP)

(*) Notice: Subject to any disclaimer, the term of this patent is extended or adjusted under 35 U.S.C. 154(b) by 64 days.

(21) Appl. No.: 10/947,271

(22) Filed: Sep. 23, 2004

(65) Prior Publication Data
US 2005/0068102 A1  Mar. 31, 2005

(30) Foreign Application Priority Data
Sep. 25, 2003 (JP) .............................. 2003-333082

(51) Int. Cl.
*H03F 1/26* (2006.01)
(52) U.S. Cl. ...................... 330/149; 455/126
(58) Field of Classification Search ............... 330/149; 455/126
See application file for complete search history.

(56) References Cited

U.S. PATENT DOCUMENTS 5,867,065 A * 2/1999 Leyendecker .............. 330/149
6,216,100 B1 * 4/2001 Meghdadi et al. ........... 703/15
6,674,808 B1 * 1/2004 Griph et al. ................ 375/285
6,731,168 B1 * 5/2004 Hedberg et al. ............ 330/149

* cited by examiner

*Primary Examiner*—Patricia Nguyen
(74) *Attorney, Agent, or Firm*—Wenderoth, Lind & Ponack, L.L.P.

(57) ABSTRACT

A memory effect distortion component compensating unit compensates for a distortion component caused by a memory effect of an amplifier by using a time difference of results from raising an input signal to even power. For example, the amplifier may include a memory effect distortion component compensating unit having an even power raising unit for raising an input signal to even power, an even power raising result delaying unit for delaying a signal of a result of even power raising, an even power raising result time difference detecting unit for detecting a difference between a signal of an even power raising result and a delayed signal, an input signal multiplying unit for multiplying a signal of a detection result by an input signal, a distortion compensation coefficient multiplying unit for multiplying a signal of a multiplication result by a distortion compensation coefficient, and a distortion compensation coefficient multiplication result adding unit for adding an input signal and a signal of a multiplication result.

20 Claims, 10 Drawing Sheets

DISTORTION-COMPENSATED AMPLIFIER USING PREDISTORTION TECHNIQUE

BACKGROUND OF THE INVENTION

1. Field of the Invention

The present invention relates to an amplifier having a function for compensating for distortion by predistortion technique (which will be called distortion-compensated amplifier using predistortion technique below) and, in particular, to a technology for reducing an influence due to the memory effect.

The technical background of the invention will be described below. However, all of those described below may not be conventional technologies.

For example, in a base station apparatus of a mobile communication system adopting Wide-band Code Division Multiple Access (W-CDMA) as a mobile communication technique, radio signals must be transmitted to the physically remote base station apparatus. Therefore, signals such as multi-carriers must be largely amplified by an amplifier such as a power amplifier (PA).

However, since an amplifier is an analog device, the input/output characteristic is a nonlinear function. Especially, after the amplification limit called the saturation point, the amount of power to be input to the amplifier increases, and substantially constant power is output. The nonlinear output causes nonlinear distortion. Though the signal component in an undesired signal band of a signal sent before amplification can be kept at a low level by a band limiting filter, nonlinear distortion occurs in the signal having passed through the amplifier. Thus, the signal component leaks to the undesired signal band (adjacent channel).

For example, since transmission power is high in a base station apparatus as described above, the magnitude of the power leaking to such an adjacent channel is strictly defined. Therefore, a big issue here is how to reduce the power leak to an adjacent channel. Accordingly, the predistortion technique has been proposed as one of distortion compensation techniques and is going mainstream instead of the feed forward technique because an amplification coefficient has been emphasized recently. The predistortion technique can compensate for distortion of signals output from an amplifier by giving in advance inverse characteristics of the AM—AM conversion and AM-PM conversion, which is nonlinearity of the amplifier, to signals input to the amplifier.

FIG. 8 shows a construction example of a functional block of an amplifier using the predistortion technique, and an operation example thereof will be described.

Once a signal is input to a power detecting portion 81, the power or amplitude of the input signal is detected. Then, the detection result is associated as a reference argument of a distortion compensation table 82 including a memory. The distortion compensation table 82 stores a table for performing distortion compensation by the predistortion technique.

An inverse characteristic of nonlinearity of an amplifier (amplifying portion 84 here) to be compensated is reflected to the table in the distortion compensation table 82. Generally, AM—AM conversion (amplitude) and AM-PM conversion (phase) using the power or amplitude of the input signal as an index is used. A predistorter 83 controls the amplitude and phase of the input signal in accordance with a reference result of the distortion compensation table 82. The signal distorted by the predistortion technique in advance is amplified by the amplifying section 84, and a signal without distortion is output. In order to adapt to an environment such as a temperature variation, the control portion 85 updates the distortion compensation table 82 based on the input signal and/or the output signal of the amplifying section 84.

However, in some distortion causing mechanisms in an amplifier, the current state depends on not only an AM—AM characteristic and AM-PM characteristic of instant power, but also a past state such as the memory effect. Since instant power is the only index for referring a distortion compensation table in some conventional methods, the nonlinear distortion caused by the memory effect cannot be compensated, which is a problem.

More specifically, the memory effect acts as hysteresis to an AM—AM characteristic and AM-PM characteristic, the influence generates unbalanced inter modulation distortion (IMD). Thus, the performance of a predistorter conventionally based on instant power of an input signal is limited. Therefore, an accurate nonlinear inverse characteristic cannot be generated by a conventional predistorter.

Here, as an example of a method for overcoming the influence of the memory effect, a distortion compensation table may be provided which has current instant power and instant power before one unit time (such as one sample) as a reference argument.

FIG. 9 shows an example of an image of the distortion compensation table in consideration of the memory effect. The horizontal axis indicates instant power while the vertical axis indicates distortion compensation control values. Changes for every one unit time are shown in FIG. 9. In other words, the distortion compensation table includes a general distortion compensation table and an order of instant power before one unit time.

For example, when a resolution of instant power is 10 bits, 1024 conventional general tables are required (for 10 bits). However, under this construction, while distortion can be compensated, a huge amount of memory is required. Furthermore, creating tables and learning for adapting to an environment are significantly difficult and may be impossible in reality.

In order to avoid these problems, values in a conventional look-up table (LUT) may be corrected by calculating a differentiation coefficient with respect to one time before and with reference to a correction table. However, since proper amounts of suitable correction depend on instant power with the same differentiation coefficient, the correction table always includes an error. Thus, a decreased amount of memory disadvantageously deteriorates the characteristic, and distortion cannot be compensated completely.

Next, the memory effect will be described in detail.

FIG. 10 shows an example model of an amplifying portion in consideration of an influence of the memory effect (refer to Non-patent Document 1, for example). Distortion occurring in the model cannot be compensated by inverse characteristics of an AM—AM characteristic and AM-PM characteristic, which is a principle of predistortion.

Since the entire construction shown in FIG. 10 is equivalent to an amplifying section in this model, processing portions 91 to 96 are not always provided in the amplifying section as they are.

An amplifier 95 functions as an amplifying section having the AM—AM characteristic and AM-PM characteristic only, that is, an amplifying section not considering the memory effect. Distortion can be completely compensated by the predistortion principle.

Here, power supply voltage of a power amplifier (PA) is desirably constant, but power supply voltage varies as described below. Thus, the memory effect occurs.

In general, distortion of the odd order occurs near a carrier as IMD (IMD3 or IMD5).

On the other hand, a frequency spectrum having a nonlinear component of the even order has a baseband and the double or more frequency component of that of an input signal. Current having a distortion component of the even order occurring in the baseband among them is fed to a drain bias circuit, and the current is converted to voltage signals by parasite inductance existing in a bias circuit and/or output matching circuit in a transistor (such as an FET).

For example, when broadband signals are used as in W-CDMA system, a higher band has distortion of even order. Thus, higher voltage has distortion of the even order, and a drain bias fluctuation is caused. Due to the drain bias fluctuation, a carrier signal is modulated again, and new distortion is caused near the carrier.

When an amplifier affected by inter modulation distortion is modeled, a so-called hysteresis characteristic is exhibited in which multiple output voltages and phases occur with respect to one input due to the memory effect of the inductor.

The fact will be described with reference to a model shown in FIG. 10.

A square law detector (square circuit) 92 detects a distortion component of the second order, which occurs in the base band, of a signal input to the amplifier 95 and is assumed as a current source in the model.

An inductance 93 corresponds to a parasite component included in a bias circuit and/or output matching circuit of the amplifier 95. For example, when a broadband signal is handled as in W-CDMA system, the band of the distortion component of the second order in the base band is increased, and the inductance 93 becomes high impedance. Thus, voltage is generated, and voltage of the bias circuit is changed.

In response to a constant phase change (having a fixed value thereof), an input signal is re-modulated by a fixed phase changer 91 with a voltage change in the bias circuit. The re-modulation is performed by a multiplier 94. A signal of a multiplication result by the multiplier 94 is added, as a memory effect component, to a signal output from a conventional amplifier model (amplifier 95) by an adder 96.

Thus, amplitude modulation of an input signal with a signal of voltage of the inductance 93 generates new distortion of the third order. Then, signals from two parts are synthesized by the adder 96, and an amplifier output signal including the influence of the memory effect is generated.

Here, a distortion component of the second order is only considered for describing the mechanism of memory effect occurrence. However, since, in general, a distortion component of the even order such as the fourth order and the sixth order occurs in the baseband, a bias component also occurs. In this case, the portion corresponding to the square law detector 92 may be replaced by the one of the even power such as the fourth power and the sixth power. Then, like the case of the second order, an output from the portion corresponding to the multiplier 94 is added to a signal output from the conventional amplifier model (amplifier 95). The memory effect cannot be compensated by a predistorter only using instant power as a reference argument like a conventional one.

Here, the constructions of the distortion-compensated amplifier using predistortion technique, an amplifying apparatus, a transmitter, a base station apparatus and so on according to the invention are not limited to the above-described constructions, and various constructions may be used instead. The invention can be provided as a method or technique for implementing processing according to the invention, a program of implementing the method or technique and/or a storage medium storing the program. Furthermore, the invention can be further provided as various apparatus and/or systems.

The field of the application of the invention is not limited to the above-described field but the invention can be applied to various fields.

The invention can be applied to various predistortion techniques.

For example, the invention can be applied to predistortion techniques for a baseband (BB), intermediate frequency (IF) band, or radio frequency (RF) band as a frequency band. The invention may be applied to the various kinds of distortion techniques whereby processing may be digitally performed or may be performed in analog form.

While FIGS. 1 and 8 show examples of a distortion-compensated amplifier using predistortion technique, the invention is not limited thereto. A digital-to-analog (D/A) converter, orthogonal modulator (or orthogonal modulating portion), up-converter, filter and so on may be used as required in accordance with a type of a used technique. The existence of a feedback signal to be sent from the amplifying sections 3 and 84 to the control portions 4 and 85 in order to adapt to an environmental change in FIGS. 1 and 8 is not especially limited and the feedback signal may be used or may not be used. Furthermore, in order to use such a feedback signal, a down-converter, an oscillator, a filter, an orthogonal demodulator (or orthogonal demodulating portion), an analog-to-digital (A/D) converter and so on may be used. In addition, in order to detect distortion, an input signal may be used.

For example, a processor in a hardware resource including processors, memories and so on may execute a control program stored in a read-only memory (ROM) to control different kinds of processing to be performed by a distortion-compensated amplifier using predistortion technique, amplifying apparatus, transmitter, base station apparatus and so on according to the invention. Moreover, each function unit for implementing the processing may be an independent hardware circuit.

The invention can be identified as a computer-readable storage medium such as a Floppy (registered trademark) disk and compact disk (CD) ROM storing the control program or as the program (itself). The processing according to the invention can be implemented by inputting the control program from the storage medium to a computer and causing a processor to execute the control program.

2. Description of the Related Art

For example, in a base station apparatus of a mobile communication system, signals to be transmitted may be amplified by an amplifier in an amplifying section of a transmitter. Furthermore, since nonlinear distortion may occur in the amplifier at some levels of input signals, the distortion may be compensated by a predistortion technique.

However, while distortion occurring in an amplifier ignoring the memory effect can be compensated by a conventional predistortion technique, influences due to the memory effect cannot be compensated, which is a problem. While, in order to solve the problem, various studies have been made (refer to Non-patent Document 1, for example), studies are still not enough and further developments have been demanded.

[Non-Patent Document 1]

"Gusuji Hizumi no Eikyo wo Ukeru Zofukuki ni Taisuru Tekiou Predistorter-Gata Hizumi Hosho (Adaptive Predistorter Type Distortion Compensation For Amplifier Influenced by Even Order Distortion)", Kawaguchi and Akaiwa, Shingakugiho, MW2002-208 (2003-03), p. 63–66.

As described with reference to the conventional example, further developments of a construction for compensating for distortion occurring in an amplifier considering the memory effect have been demanded in addition to a conventional distortion-compensated amplifier using predistortion technique.

SUMMARY OF THE INVENTION

The invention was made in view of the conventional issues. Accordingly, it is an object of the invention to provide a distortion-compensated amplifier by predistortion technique, which can reduce an influence by the memory effect.

In order to achieve the object, a distortion-compensated amplifier using predistortion technique according to one aspect of the invention compensates for distortion occurring in the amplifier for amplifying input signals by a predistortion technique as follows:

A memory effect distortion component compensating unit compensates for a distortion component caused by the memory effect of the amplifier by using a time difference of results from raising an input signal to even power.

In one construction example, the distortion-compensated amplifier using predistortion technique of the invention is constructed as follows.

In this case, the memory effect distortion component compensating unit in the distortion-compensated amplifier using predistortion technique may have an even power raising unit for raising an input signal to even power, an even power raising result delaying unit for delaying a signal of a result of even power raising by the even power raising unit, an even power raising result time different detecting unit for detecting a difference between a signal of an even power raising result by the even power raising unit and a delayed signal by the even power raising result delaying unit, an input signal multiplying unit for multiplying a signal of a detection result by the even power result time difference detecting unit by an input signal, a distortion compensation coefficient multiplying unit for multiplying a signal of a multiplication result by the input signal multiplying unit by a distortion compensation coefficient, and a distortion compensation coefficient multiplication result adding unit for adding an input signal and a signal of a multiplication result by the distortion compensation coefficient multiplying unit.

Thus, with the simple construction, an influence of a distortion component due to the memory effect of the amplifier can be reduced.

Here, various kinds of signal may be used as an input signal.

Various kinds of value may be used as the order of an even power (that is, "n" of the even $n^{th}$ power) raising. In addition, multiple orders may be used as even powers like "square fourth power and sixth power".

Various kinds of value may be used as a time difference of results from raising an input signal to even powers.

Various times may be used as a delay time of a signal resulting from even-power raising in accordance with a time difference required for a signal resulting from even-power raising.

Various kinds of value may be used as a distortion compensation coefficient.

Various degrees may be used as a degree (accuracy) of compensating for a distortion component if practically effective.

The distortion-compensated amplifier using predistortion technique may further includes a nonlinear distortion component compensating unit for compensating for a distortion component caused by the nonlinearity of an AM (Amplitude Modulation)-AM characteristic and AM-PM (Phase Modulation) characteristic of the amplifier.

In other words, the nonlinear distortion component compensating unit may have an even power raising unit for raising an input signal to even power, an even power raising result multiplying unit for multiplying a signal of a result of even power raising by the even power raising unit by an input signal, a distortion compensation coefficient multiplying unit for multiplying a signal of a multiplication result by the even power raising result multiplying unit by a distortion compensation coefficient, and a distortion compensation coefficient multiplication result adding unit for adding an input signal and a signal of a multiplication result by the distortion compensation coefficient multiplying unit.

Therefore, for example, with the simple construction, an influence of a distortion component by the AM—AM characteristic and AM-PM characteristic of an amplifier can be reduced. Furthermore, an influence of a distortion component due to the memory effect of an amplifier can be reduced. Thus, highly accurate distortion compensation can be implemented as a whole.

Here, various kinds of value may be used as the order of an even power (that is, "n" of the even $n^{th}$ power) raising. In addition, multiple orders may be used for even power raising.

Various values may be used as a distortion compensation coefficient.

Furthermore, a construction example according to the invention will be described below.

In a construction example, the memory effect distortion component compensating unit may have an even power raising unit for raising an input signal to even power, an even power raising result delaying unit for delaying a signal of a result of even power raising by the even power raising unit, an even power raising result time different detecting unit for detecting a difference between a signal of an even power raising result by the even power raising unit and a delayed signal by the even power raising result delaying unit, an even-power-raising-result-time-difference-to-control-value correspondence storage unit for storing a correspondence between a value detected by the even power raising result time difference detecting unit and a control value, and an input signal changing unit for changing an input signal in accordance with a control value corresponding to a value detected by the even power raising result time difference detecting unit based on data stored in the even-power-raising-result-time-difference-to-control-value correspondence storage unit.

In this case, the input signal changing unit may be a multiplying unit for multiplying a control signal by an input signal.

Alternatively, the input signal changing unit is an input signal amplitude/phase changing unit for changing one or both of an amplitude and phase of an input signal based on a control value.

In another construction example, the amplifier may include a control portion for performing feedback processing and processing based on a level of an input signal in relation to distortion compensating processing by the nonlinear distortion component compensating unit and distortion compensating processing by the memory effect distortion component compensating unit.

In another construction example, the amplifier may further include a control portion for alternately and repeatedly performing processing of updating and converging parameters of distortion compensating processing by the nonlinear distortion component compensating unit, updating and converging parameters of distortion compensating processing by the memory effect distortion component compensating unit, and updating and converging parameters of distortion compensating processing by the nonlinear distortion component compensating unit and processing of updating and converging parameters of distortion compensating processing by the memory effect distortion component compensating unit.

In this case, various factors such as a distortion compensation coefficient and a correspondence for control stored in a table, may be used as a parameter.

In another construction example, an input signal may be a complex number. In another construction example, a distortion compensation coefficient may be a signal of a complex number. In another construction example, a multiplying unit for multiplying a signal of a complex number may use a complex multiplier.

In another construction example, a distortion-compensated amplifier by predistortion technique may be provided in a base station apparatus of a mobile communication system such as a mobile telephone system and a personal handy phone system (PHS), and an input signal may be a signal to be transmitted by radio to a mobile station apparatus.

As described above, in order to compensate for distortion caused in an amplifier, which amplifies an input signal, by predistortion technique by using a distortion-compensated amplifier using predistortion technique according to the invention, a time difference of results of raising an input signal to even powers is used to compensate for a distortion component caused by the memory effect of the amplifier. Thus, with a simple construction, an influence of a distortion component due to the memory effect of the amplifier can be reduced. Therefore, highly accurate distortion compensation can be achieved.

DESCRIPTION OF THE PREFERRED EMBODIMENTS

Embodiments according to the invention will be described with reference to drawings.

In this embodiment, the invention is applied to a distortion-compensated amplifier using predistortion technique in a base station apparatus of a mobile communication system. The distortion-compensated amplifier using predistortion technique amplifies multi-carrier signals to be amplified, compensates for distortion occurring in the amplifier and, at the same time, compensates for an influence of the memory effect of the amplifier.

First of all, a configuration example of the distortion-compensated amplifier using predistortion technique according to this embodiment will be described.

Figure 1:
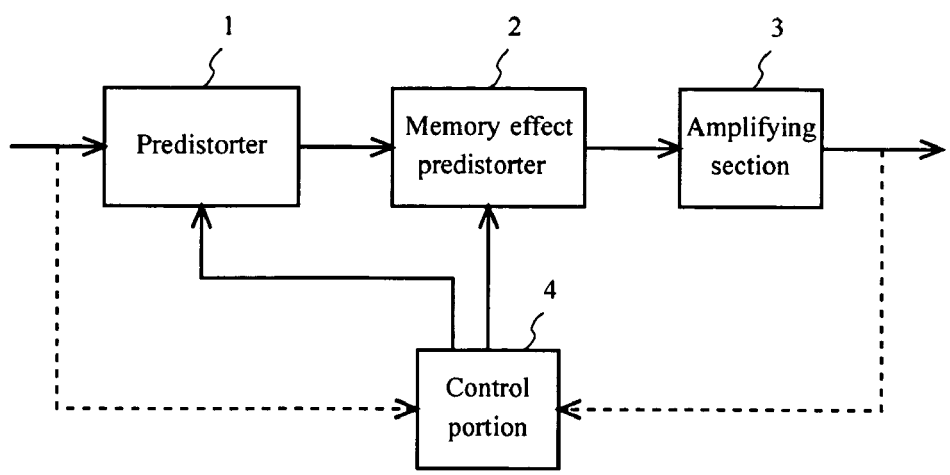
FIG. 1 is a diagram showing a configuration example of a distortion-compensated amplifier using predistortion technique according to an embodiment.

As shown in FIG. 1, the distortion-compensated amplifier using predistortion technique according to this embodiment includes a predistorter 1, a memory effect predistorter 2, an amplifying section 3, and a control portion 4. In this case, the predistorter 1 modulates an amplitude and phase of a signal input to the amplifier in order to give an inverse characteristic (predistortion) compensating for non-linear distortion of an AM—AM characteristic and AM-PM characteristic. The memory effect predistorter 2 modulates an amplitude and phase of a signal output from the predistorter 1 in order to give an inverse characteristic (predistortion) compensating for distortion caused by the memory effect. The amplifying section 3 amplifies a send signal to be distortion-compensated. The control portion 4 adaptively controls the predistorter 1 and the memory effect predistorter 2.

The predistorter 1 compensates for distortion based on instant power like a conventional one, for example, and includes a power detecting portion and/or a look-up table (LUT) as required. The predistorter 1 compensates for an AM—AM characteristic or AM-PM characteristic of an amplifier of the amplifying section 3. In this embodiment, the predistorter 1 does not compensate for the memory effect.

The memory effect predistorter 2 compensates for distortion caused by the memory effect of the amplifier of the amplifying section 3. In this embodiment, the memory-effect predistorter 2 raises an input signal to an even power and uses a difference signal between the even-power-raised signal and a signal resulting from a delay of the even-power-raised signal.

Here, distortion caused by an AM—AM characteristic or an AM-PM characteristic and distortion caused by the memory effect depend on a signal input to the amplifying section 3 and do not depend on a signal input to the distortion-compensated amplifier using predistortion technique. Thus, distortion caused in the amplifying section 3 depends on a signal including changes in amplitude and a phase shift caused by giving an inverse characteristic of distortion in the predistorter 1 and the memory effect predistorter 2.

According to the study by the inventors, a better characteristic can be obtained when the memory effect predistorter 2 is disposed after the predistorter 1 like this embodiment, since amounts of changes in amplitude and phase caused in the predistorter 1 are larger than amounts of changes in amplitude and phase caused in the memory effect predistorter 2.

On the other hand, under the construction having the predistorter 1 after the memory effect predistorter 2, the memory-effect predistorter 1 compensates for the memory effect in response to an input, to the amplifying section 3, of a signal input to the distortion-compensated amplifier using predistortion technique. However, since the amounts of changes in amplitude and phase caused in the predistorter 1 are larger, a difference between an influence of the memory effect expected by the memory effect predistorter 2 and an influence of the actually caused memory effect may increase.

The amplifying section 3 includes one or multiple amplifiers and has nonlinearity and memory-effect characteristic to be distortion-compensated. In general, in order to compensate for distortion to −50 to −60 dBc or below by using a predistorter, the compensation is influenced by the memory effect.

The controller 4 sets a distortion compensation table and/or distortion compensation coefficient of each of the predistorters 1 and 2 and performs processing for adapting to a change in environment and so on.

Next, a principle to be used by the memory effect predistorter 2 according to this embodiment will be described.

In this embodiment, since the memory effect is caused by a bias change in parasite inductance due to caused power, the influence of the memory effect is compensated as follows.

A change V(t) in electromotive force, that is, power supply voltage caused by an inductor can be expressed by:

$$V(t)=L \cdot \{di(t)/dt\} \quad [\text{EQ1}]$$

where t is a time, L is an inductor [H: Henry] and i(t) is a current.

EQ1 can be expressed by:

$$V(t)=L \cdot \{i(t)-i(t-\Delta t)\}/\Delta t \quad [\text{EQ2}]$$

where $\Delta t$ is an infinitesimal time.

In this embodiment, an approximation of distortion caused by the memory effect in an amplifier is made by using EQ2, and a signal −V(t) canceling the distortion is added to an input to the amplifier in advance. Thus, the memory effect can be compensated. In hardware according to this embodiment, $\Delta t$ is preferably handled as T (=1 clock, which is the minimum unit time). However, for example, $\Delta t$ falls in the scope of this embodiment as far as a differentiation can be approximated by a difference. Furthermore, in this embodiment, differences are only handled, and a simple construction is provided thereby. In this case, EQ2 is considered as:

$$V(t)=L \cdot \{i(t)-i(t-T)\} \quad [\text{EQ3}]$$

FIRST EXAMPLE

The memory effect predistorter 2 according to a first example of the invention will be described.

Figure 2:
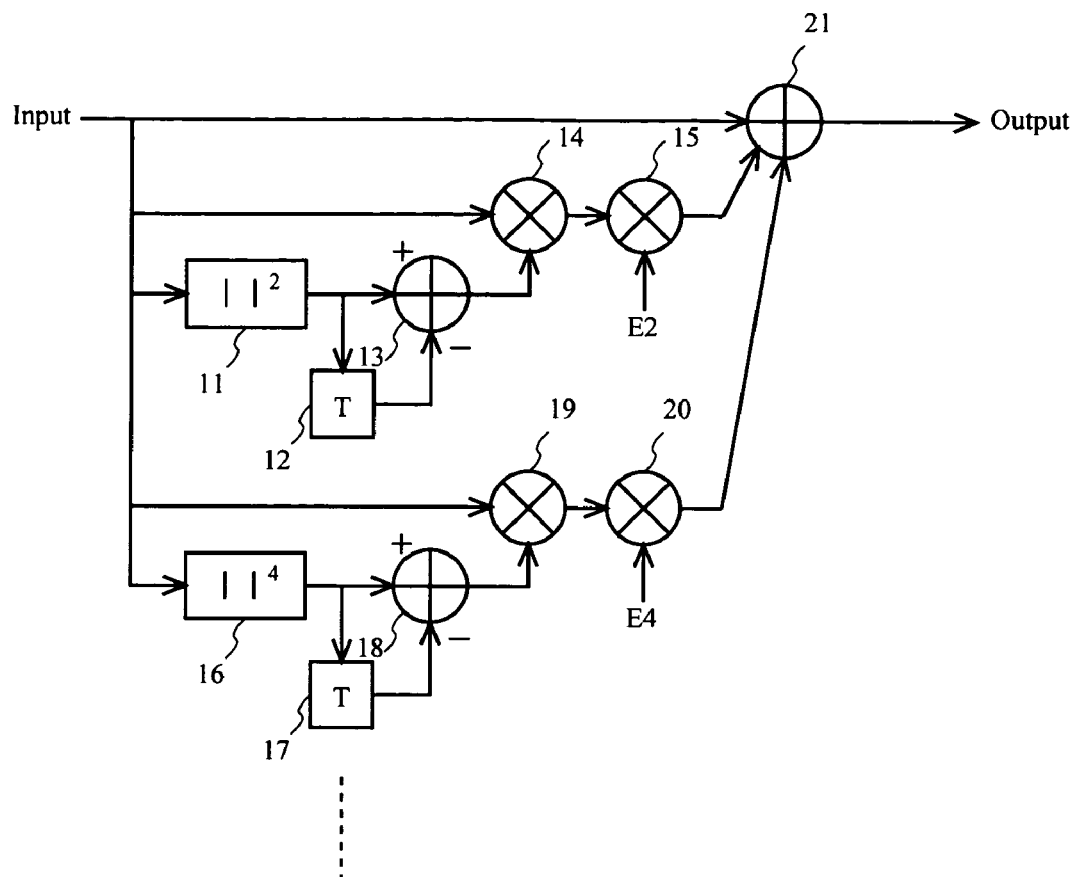
FIG. 2 is a diagram showing a configuration example of a memory effect predistorter according to a first embodiment of the invention.

As shown in FIG. 2, the memory effect predistorter 2 of this example includes a square law detector 11, a delay circuit 12, a subtractor 13, and two (complex) multipliers 14 and 15, similarly, a fourth power law detector 16, a delay circuit 17, a subtractor 18 and two (complex) multipliers 19 and 20, and an adder 21.

An example of an operation of the memory effect predistorter 2 according to this example will be described.

Input signals are I, Q digital baseband signals with complex vectors. In this example, input signals are signals output from the predistorter 1.

The square law detector 11 detects a square value of predistorter input signals and generally calculates a value of $(I^2+Q^2)$. The delay circuit 12 delays an output (detected value) from the square law detector 11 by T [sec]. The subtractor 13 subtracts the output of the square law detector 11 T [sec] ago, which is an output from the delay circuit 12, from the output of the square law detector 11. A signal P2 output from the subtractor 13 is a square difference in:

$$P2=|I(t)^2+Q(t)^2|-|I(t-T)^2+Q(t-T)^2| \quad [\text{EQ4}]$$

where the input signals I and Q are expressed by I(t) and Q(t), respectively.

T is preferably one clock time. However, T falls in the scope of this example as far as a differentiation can be approximated by a difference. The square difference corresponds to a differentiation coefficient.

The multiplier 14 multiples an input signal by a square difference value from the subtractor 13. The output corresponds to a signal resulting from re-modulation of a carrier signal, is therefore a cubic component and has a frequency component close to a carrier frequency. The multiplier 15 multiples an output from the multiplier 14 by a distortion compensation coefficient E2.

The distortion compensation coefficient E2 is expressed by a complex vector (E2real+j·E2imag) and is defined such that the control portion 4 can compensate for distortion. Here, j is an imaginary part, E2real is a real component of E2, and E2imag is an imaginary component of E2.

A complex vector E2 can be expressed by:

$$E2=|Amp| \cdot \exp(j \cdot \text{Phase})$$

$$|Amp|=sqrt\{(E2real)^2+(E2imag)^2\}$$

$$\text{Phase}=\tan^{-1}\{(E2imag)/(E2real)\} \quad [\text{EQ5}]$$

where sqrt is a square root, |Amp| is an amplitude component and Phase is a phase component. An amplitude component |Amp| is in proportion to a magnitude of L in EQ3 and corresponds to a fixed gain giving an amplitude of a second order distortion, for example. A phase component Phase is a phase shift fixed to an input signal, for example, and is defined so as to cancel a phase change φ by the fixed phase changer 91 as the opposite phase, for example.

While the signal path of the square law detector 11 has been described above, the same processing is performed on the signal path of the fourth-power law detector 16.

That is, the fourth power law detector 16 detects a fourth power value of an input signal, and the delay circuit 17 delays the fourth power value. The subtractor 18 detects a difference between the undelayed fourth power value and the delayed fourth power value, and the multiplier 19 multiplies the difference by the input signal. Then, the multiplier 20 multiplies the multiplication result and the distortion compensation coefficient E4.

The third order component, which is the multiplication result by the multiplier 15, and the fifth order component, which is the multiplication result by the multiplier 20, are input to the adder 21.

The adder 21 adds the input signal and the outputs from the third order and fifth order predistorters (multipliers 15 and 20) and outputs the addition result. In this example, the output signals are output to the amplifying section 3.

An output signal SPD2(t) from the memory effect predistorter 2 in this example can be expressed by:

$$SPD2(t)=S2(t)+\text{Diff}2(t)\cdot E2-S2(t)+\text{Diff}4(t)\cdot E4-S2(t)$$

$$\text{Diff}n(t)=|S2(t)|^n-|S2(t-T)|^n \qquad [EQ6]$$

(n=2 or 4)

where S2(t) is a signal input to the memory effect predistorter 2. When an output signal SPD2(t) in EQ6 is input to an amplifier in the amplifying section 3, the output signal SPD2(t) cancels the influence of the memory effect caused in the amplifier. Thus, the signal output from the amplifying section 3 no longer has the influence of the memory effect, that is, the distortion due to the memory effect can be compensated.

In this example, the third order by the signal path of the square law detector 11 and the fifth order of the signal path of the fourth power law detector 16 are only illustrated. However, the number of kinds of order to be used is not especially limited and can be extended by using detectors of other even powers (sixth power, eighth power and so on) for other odd orders (seventh order, ninth order and so on) instead of the square law detector 11 and the fourth power law detector 16.

As described above, a distortion-compensated amplifier by a predistortion technique includes a function for raising complex input signals to an even power, a delay function for delaying an output signal from the even power raising function, an adding (or subtracting) function for calculating a difference between an output signal of the even power raising function and an output signal of the delay function, a multiplying function for multiplying an input signal by an output signal of the adding function, a complex multiplying function for multiplying an output signal of the multiplying function by a complex distortion compensation coefficient and an adding function for adding an input signal and an output signal of the complex multiplying function.

Therefore, when the memory effect predistorter 2 in this example is used and when an input signal is amplified by an amplifier, an influence of a distortion component caused by the memory effect occurring in the amplifier can be compensated. Thus, adjacent channel leak power and/or spurious output can be reduced, and the power efficiency can be increased. Furthermore, the circuit size can be reduced relatively, for example.

SECOND EXAMPLE

A memory effect predistorter 2 according to a second example of the invention will be described.

Figure 3:
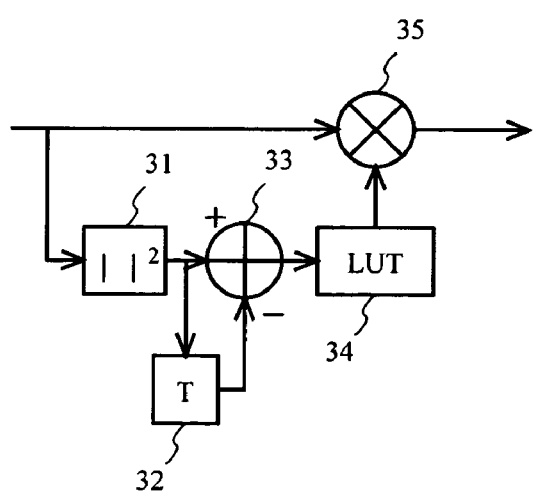
FIG. 3 is a diagram showing a configuration example of a memory effect predistorter according to a second embodiment of the invention.

As shown in FIG. 3, the memory effect predistorter 2 according to this example includes a square-law detector 31, a delay circuit 32, a subtractor 33, a look-up table (LUT) 34, and a (complex) multiplier 35. Here, operations of the square law detector 31, delay circuit 32 and subtractor 33 are the same as those of the square law detector 11, delay circuit 12 and subtractor 13 in FIG. 2, for example.

The LUT 34 stores a table for memory-effect compensation, which is automatically converged by a control portion 4. For the LUT 34, an output from the subtractor 33 is used as a table reference argument.

The multiplier 35 multiplies a complex vector for distortion compensation stored in the LUT 34 by an input signal, and the multiplication result is handled as a signal output to the amplifying section 3.

When a signal output from the memory effect predistorter 2 in this example is input to an amplifier in the amplifying section 3, the amplifier outputs a signal free from influence of the memory effect. Since a signal input to the memory effect predistorter 2 in this example is a signal output from the predistorter 1, the amplifier of the amplifying section 3 outputs a signal having no distortion.

While the case for the third order has been only illustrated according to this example, extensions can be achieved for other odd orders like the first example.

As described above, the memory effect predistorter 2 in this example includes a function for raising complex input signals to an even power, a delay function for delaying an output signal of the even power raising function, an adding (or subtracting) function for calculating a difference between an output signal of the even power raising function and an output signal of the delay function, a memory function for a look-up table storing control values for distortion compensation, and a complex multiplying function for multiplying an input signal by an output signal from the memory. Also in this example, the same advantages can be obtained as those of the first example.

THIRD EXAMPLE

A memory effect predistorter 2, which is an RF predistorter according to a third example of the invention, will be described.

As shown in FIG. 4A, the memory effect predistorter 2 in this example includes a square law detector 41 having a square circuit, a delay circuit 42 having a delay element, a subtractor 43 having hardware such as an operational amplifier, an analog-to-digital (A/D) converter 49a for performing A/D conversion, a look-up table (LUT) 44, two digital-to-analog (D/A) converters 45 and 46, a voltage adjustable attenuator 47, and a voltage adjustable phase shifter 48. Here, operations of the square law detector 41, the delay circuit 42, the subtractor 43 and the LUT 44 are the same as those of the square law detector 31, the delay circuit 32, the subtractor 33 and the LUT 34 shown in FIG. 3. Alternatively, in another construction shown in FIG. 4B, instead of the A/D converter 49a shown in FIG. 4A, an A/D converter 49b is provided next to the square law detector 41. The delay circuit 42 and the subtractor 43 include a digital circuit or a digital signal processor like the delay circuit 32 and the subtractor 33 shown in FIG. 3, for example.

Each of the D/A converters 45 and 46 converts a control value stored in the LUT 44 to a voltage control signal by D/A conversion. On the other hand, a control signal for controlling the voltage adjustable attenuator 47 is input from the LUT 44 to the D/A converter 45, and a control value for controlling the voltage adjustable phase shifter 48 is input from the LUT 44 to the other D/A converter 46.

The voltage adjustable attenuator 47 and the voltage adjustable phase shifter 48 are controlled by output signals from the D/A converters 45 and 46, respectively, and function together as a complex multiplier (such as the complex multiplier shown in FIG. 3). This is especially effective for a case where an interface with the outside of a distortion-compensated amplifier is an RF signal.

While the case for the third order has been only illustrated according to this example, extensions can be achieved for other odd orders like the first example.

As described above, the memory effect predistorter 2 in this example includes a function for raising input signals to an even power, a delay function for delaying an output signal from the even power raising function, an adding (or subtracting) function for calculating a difference between an output signal of the even power raising function and an output signal of the delay function, a memory function for a look-up table storing control values for distortion compensation, a D/A converting function for converting an output of the memory function to analog signals, an attenuator for adjusting an amount of attenuation of an input signal in accordance with an output signal of the D/A converting function, and a phase shifter for adjusting an amount of phase shift of an input signal in accordance with an output signal of the D/A converter. Also in this example, the same advantages can be obtained as those of the first example.

FOURTH EXAMPLE

A predistorter 1 according to a fourth example of the invention will be described.

Figure 5:
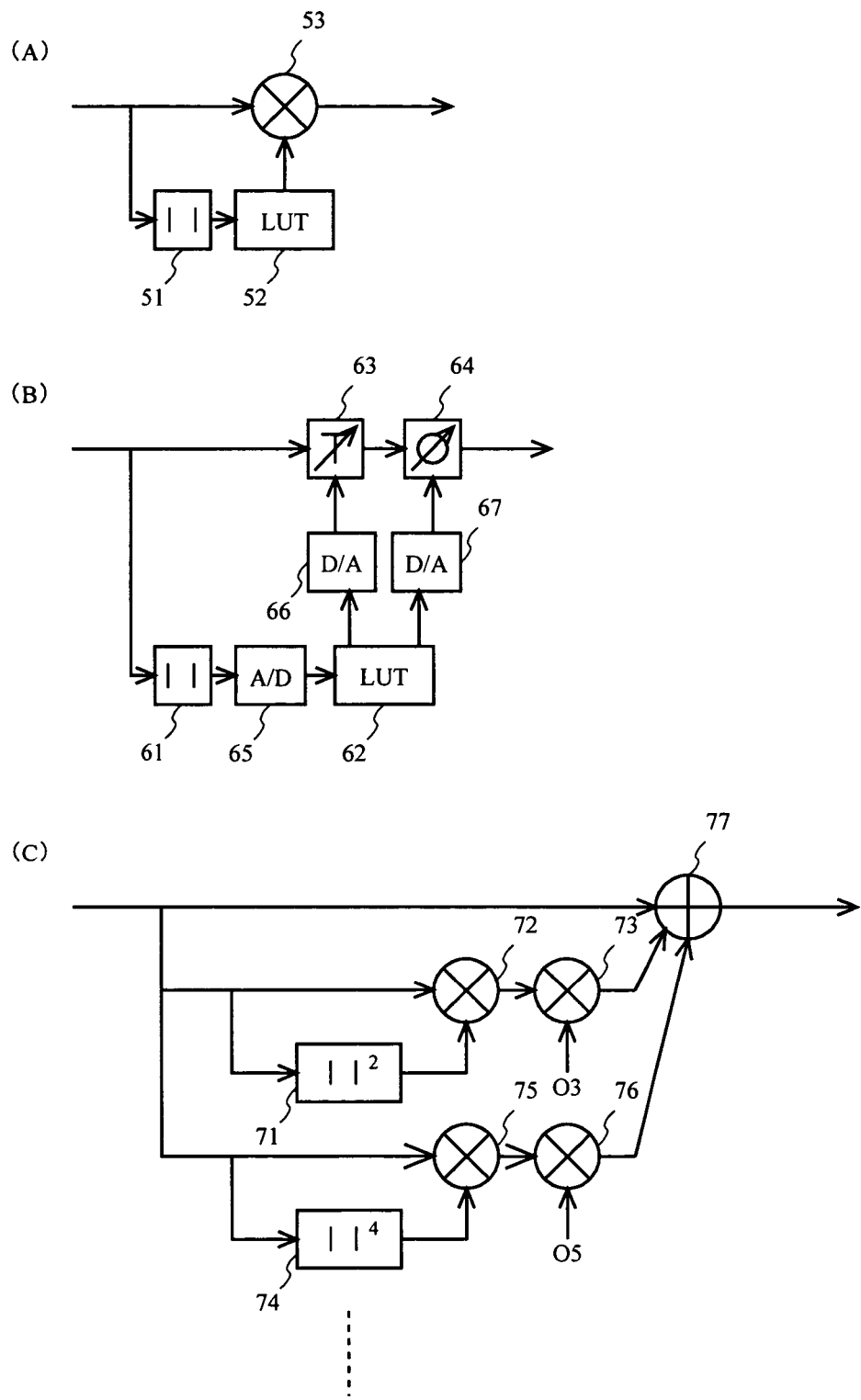
FIGS. 5A to 5C are diagrams each showing a configuration example of a predistorter according to a fourth embodiment of the invention.

FIG. 5A shows a configuration example of the predistorter 1.

The predistorter 1 in this example includes an envelope detector circuit 51, a look-up table (LUT) 52 and a (complex) multiplier 53.

The envelop detector circuit 51 detects envelope voltage or power of an input signal, and the output (detected value) corresponds to instant power of the input signal. By using a distortion compensation coefficient stored in the LUT 52 by using the output as a reference argument, the complex multiplier 53 complex-multiplies the distortion compensation coefficient and the input signal. Thus, inverse characteristics of an AM—AM characteristic and AM-PM characteristic are given to the input signal. The signal to which the inverse characteristics have been given is output to the memory effect predistorter 2.

FIG. 5B shows another configuration example of the predistorter 1 for performing analog predistortion.

The predistorter 1 in this example includes an envelope detector circuit 61, an A/D converter 65 for performing A/D conversion, a look-up table (LUT) 62, two D/A converters 66 and 67 for performing D/A conversion, a voltage adjustable attenuator 63, and a voltage adjustable phase shifter 64. Input signals are RF signals.

The envelope detector circuit 61 detects envelop voltage or power of an input signal. The A/D converter 65 performs A/D conversion on the output (detected value), and the D/A converters 66 and 67 output an amplitude control value and phase control value stored in the LUT (that is, distortion compensation table) 62 as reference arguments. The voltage adjustable attenuator 63 and the voltage adjustable phase shifter 64 are controlled by the control values, and inverse characteristics of an AM—AM characteristic and AM-PM characteristic thereof are given to the input signal thereby. The signal to which the inverse characteristics have been given is output to the memory effect predistorter 2.

FIG. 5C shows another configuration example of the predistorter 1.

The predistorter 1 in this example includes a square law detector 71 and two (complex) multipliers 72 and 73, a fourth power law detector 71 and two (complex) multipliers 75 and 76, and an adder 77. Input signals here are complex I and Q baseband digital signals.

The square law detector 71 calculates the square value of an input signal. The multiplier 72 multiplies the square value by the input signal. The output (the multiplication result) has the amplitude of the input raised to the third power, and the phase can be maintained therein. The multiplier 73 complex-multiplies the output signal from the multiplier 72 by a distortion compensation coefficient O3.

Similarly, the fourth-power law detector 74 calculates the fourth power value of an input signal. The multiplier 75 multiplies the fourth-power value by the input signal. The output (the multiplication result) has the amplitude of the input raised to the fifth power, and the phase can be maintained therein. The multiplier 76 complex-multiplies the output signal from the multiplier 75 by a distortion compensation coefficient O5.

The distortion compensation coefficient O3 is expressed by a complex vector (O3real+j·O3imag) and is defined such that the control portion 4 can compensate for distortion. Here, O3real is a real component of O3, and O3imag is an imaginary component of O3.

A complex vector O3 can be expressed by:

$$O3 = |Amp| \exp(j\, Phase)$$

$$|Amp| = sqrt\{(O3real)^2 + (O3imag)^2\}$$

$$Phase = \tan^{-1}\{(O3imag)/(O3real)\} \qquad [EQ7]$$

where |Amp| is an amplitude component and Phase is a phase component.

This is true for a distortion compensation coefficient O5.

The adder 77 adds an input signal, a complex multiplication result of the third order input from the multiplier 73 and a complex multiplication result of the fifth order input from the multiplier 76 and outputs the addition result to the memory effect predistorter 2. In this way, the adder 77 adds signals of the odd order (such as third order, fifth order and seventh order) to an input signal and gives the inverse characteristic of an AM—AM characteristic and AM-PM characteristic thereto.

An output signal SPD1($t$) from the predistorter 1 in this example can be expressed by:

$$SPD1(t) = S1(t) + O3 \cdot S1'^{3}(t) + O5 \cdot S1'^{5}(t)$$

$$S1'^{n}(t) = |S_1(t)|^{n-1} \cdot S1(t)$$

$$(n=3 \text{ or } 5) \qquad [EQ8]$$

where S1($t$) is a signal input to the predistorter 1 in this example. Since a coefficient of a basic wave is fixed to (1+j·0) in this example, the constant gain and phase of the input signal are maintained in the predistorter 1.

When a predistortion component of an output signal from the predistorter 1 in this example is input to the amplifier in the amplifying section 3, the influence of the AM—AM characteristic and AM-PM characteristic caused in the amplifier is canceled. Thus, the signal output from the amplifying section 3 no longer has the distortion, that is, the distortion can be compensated.

In this example, the cases with the third order and the fifth order are only illustrated. However, like the first example, extension can be performed on other odd orders. In this construction according to this example, a memory (LUT) is not required, which is an advantage.

As described above, the predistorter 1 according to this example includes a function for raising a complex input signal to an even power, a multiplying function for multiplying an input signal by an output signal of the function for raising to an even power, a complex multiplying function for multiplying the output signal of the multiplying function by a complex distortion compensation coefficient and an adding function for adding an input signal and the output signal of the complex multiplying function.

FIFTH EXAMPLE

A convergence algorithm of a distortion-compensated amplifier using predistortion technique according to a fifth example of the invention will be described.

In this example, the predistorter 1 and the memory effect predistorter 2 may have various kinds of construction.

Figure 6:
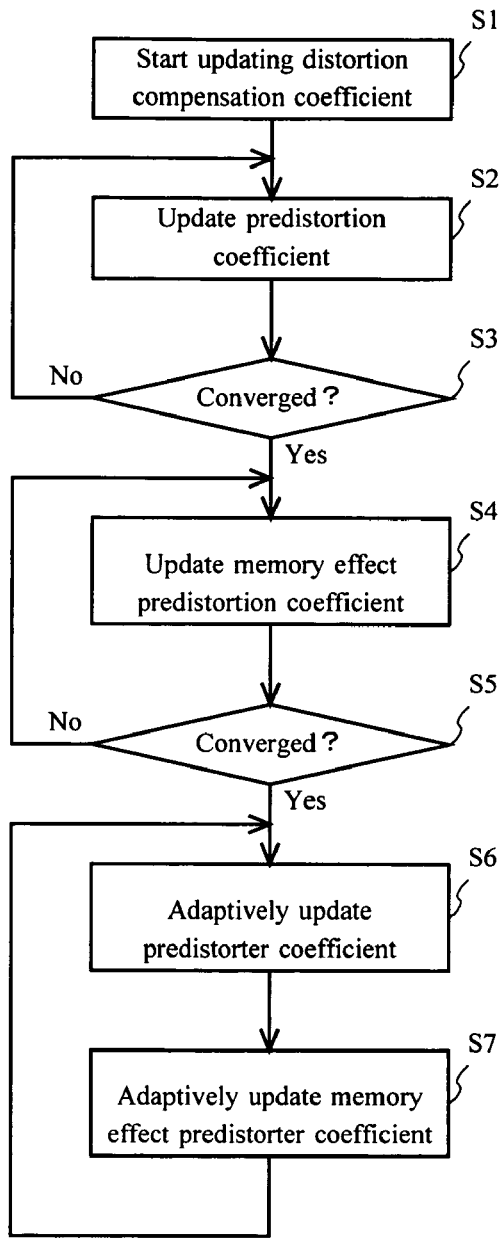
FIG. 6 is a diagram showing an example of steps of update processing on a distortion compensation coefficient according to a fifth embodiment of the invention.

FIG. 6 shows an example of a processing flow of the convergence algorithm of this example.

In the processing flow of the convergence algorithm in this example, once a process for updating a distortion compensation coefficient starts (step S1), distortion compensation coefficients O3, O5 and so on (or the LUT) of the predistorter 1 are first updated (step S2) and are converted to an optimum value, which can compensate for distortion most (step S3). Next, distortion compensation coefficients E2, E4 and so on (or LUT) of the memory effect predistorter 2 are updated (step S4) and are converged to an optimum value, which can compensate for distortion most (step S5). Then, the update process on distortion compensation coefficients are not ended even after the convergence of the first order, and the processing goes to subsequent steps. That is, distortion compensation coefficients of the predistorter 1 and the memory effect predistorter 2 are updated alternately (steps S6 and S7), and the predistorter 1 and the memory effect predistorter 2 are adapted to various kinds of variations such as a temperature variation and an aging variation.

Here, distortion caused by an AM—AM characteristic and AM-PM characteristic is generally larger and more dominant than distortion caused by the memory effect. Thus, like this example, the convergence time of processing of updating and converting distortion compensation coefficients of the predistorter 1 and then updating and converting distortion compensation coefficients of the memory effect predistorter 2 can be shorter than the convergence time of the reverse processing (that is, the speed of the convergence can be increased).

For example, as expressed in EQ5 and EQ7, complex coefficients may be divided with respect to an amplitude |Ampl| and a phase Phase and be converged. Alternatively, real complex coefficients and imaginary complex coefficients may be converged separately, or two variables may be converged together. When a LUT is used, complex coefficients may be converged by using representative points, for example, or may be collectively created by a spline technique. Alternatively, distortion compensation coefficients of the predistorter 1 and/or distortion compensation coefficients of the memory effect predistorter 2 may be collectively converged by using Minimum Means Square Error (MMSE).

In order to control update of the distortion compensation coefficients (or a LUT) of the predistorter 1 and/or the memory effect predistorter 2, a signal output from the amplifying section 3 can be used as a feedback signal.

For example, a signal output from the amplifying section 3 is used as a feedback signal and is frequency-converted by a mixer. Then, unnecessary waves such as carriers are removed therefrom by a band-pass filter, and distorted power is only detected. An oscillator is controlled in order to evaluate distorted power at different frequencies such as IMD3+ and IMD3− by using a digital signal processor (DSP), for example. For example, a perturbation technique is used for the algorithm, and coefficients and so on can be updated such that the detected distorted power can be small. The algorithm can be achieved simply at low cost, which is an advantage. Alternatively, a distorted signal may be demodulated, and an error with respect to the input signal may be extracted. However, in this case, the speed must be increased, and the cost may increase.

In this algorithm, update processing is performed every time when a gain of the third order of the predistorter 1 is given first and is performed for phases of the third order next. The processing is sequentially performed as required for the fifth order, seventh order and so on. Once all coefficients of the predistorter 1 are converged, coefficients of the memory effect predistorter 2 are converged similarly. After that, even when all of the coefficients are converged, the DSP, for example, continues updating to adaptively follow an environment varied in accordance with a temperature and/or aging.

As described above, in order to perform adaptive control for converging coefficients and/or a table relating to control over distortion compensation in the distortion-compensated amplifier by the predistortion technique in this example, coefficients of the predistorter 1 are converged first, and coefficients of the memory effect predistorter 2 are converged next. After that, updating is repeated thereon alternately.

SIXTH EXAMPLE

An example of a result of simulation according to a sixth example of the invention will be described.

Figure 7:
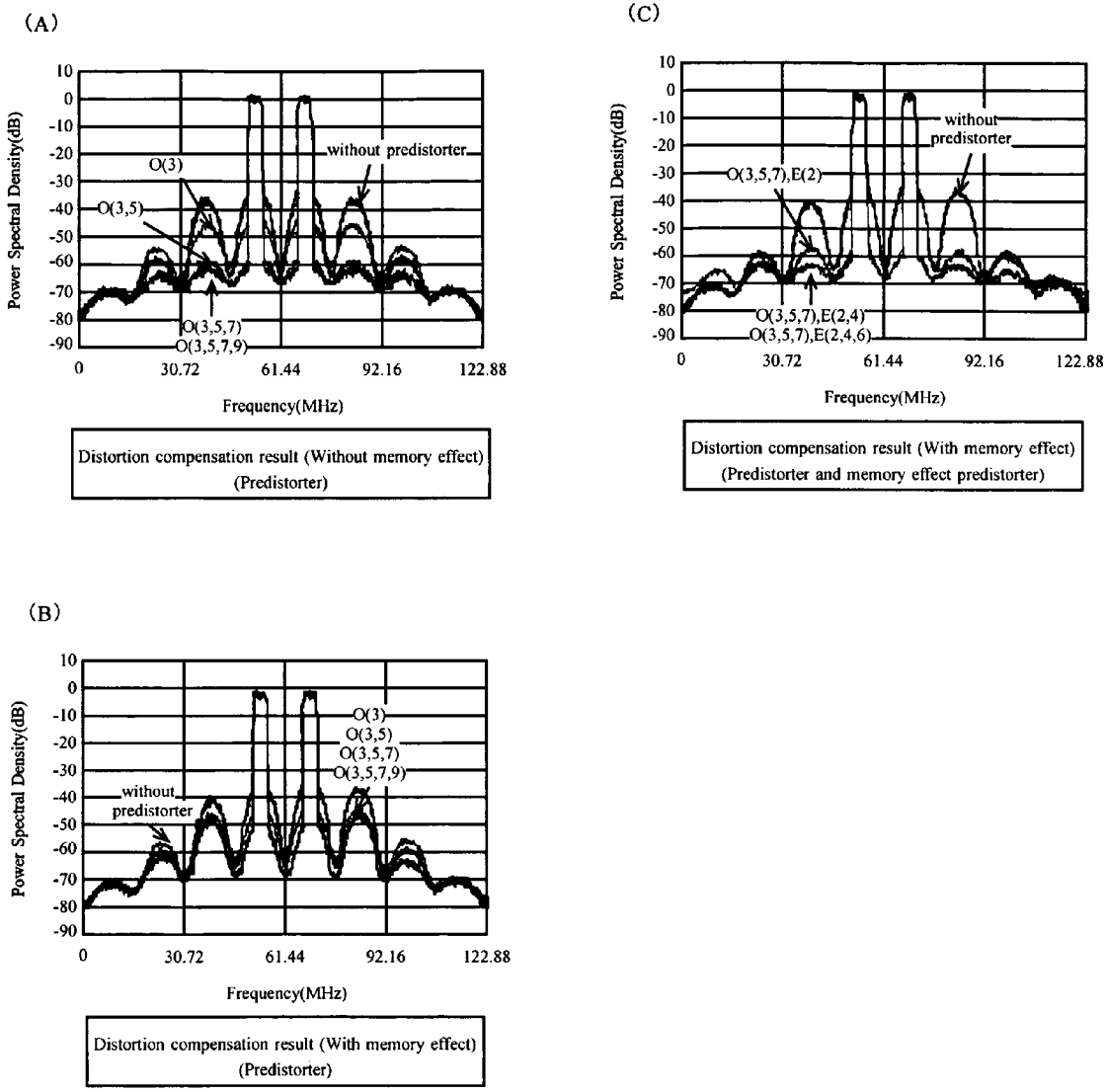
FIGS. 7A to 7C are diagrams each showing an example of a result of simulation of distortion compensation according to a sixth embodiment of the invention.
Figure 8:
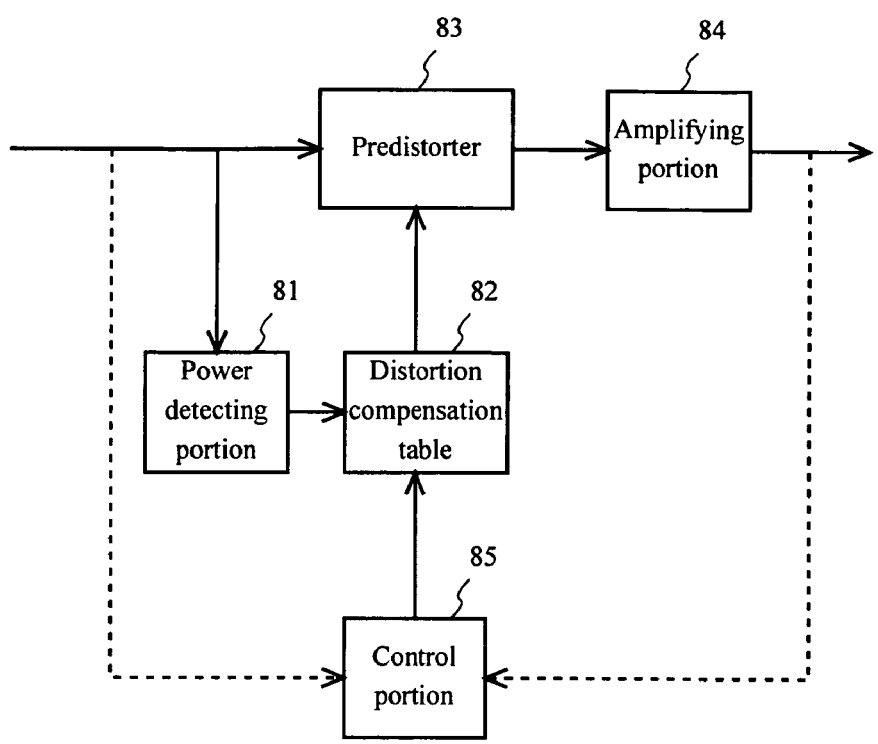
FIG. 8 is a diagram showing a configuration example of a distortion-compensated amplifier using predistortion technique.
Figure 9:
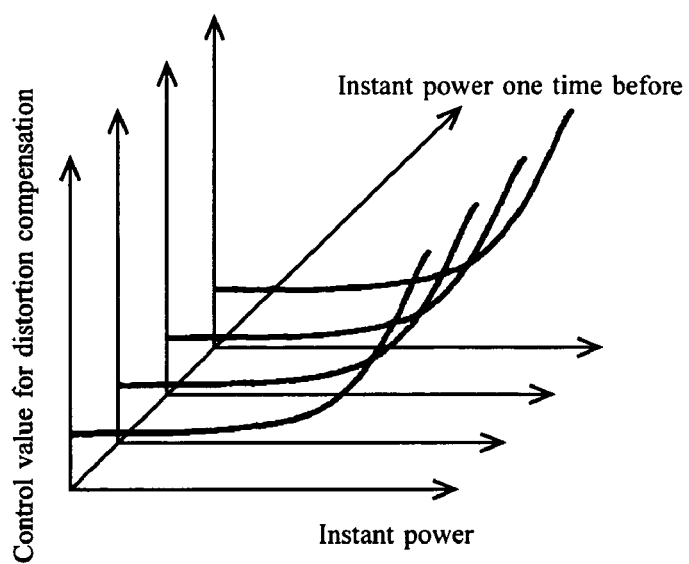
FIG. 9 is a diagram showing an example of an image of a distortion compensation table considering the memory effect.
Figure 10:
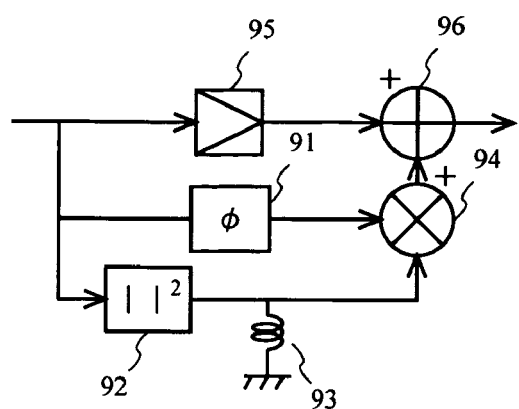
FIG. 10 is a diagram showing an example of a model of an amplifying section considering the memory effect.

FIG. 7A shows an example of a result of simulation where the predistorter 1 shown in FIG. 5C is used, the memory effect predistorter 2 is not provided, and the memory effect of the amplifier is not caused. The horizontal axes of the graphs in FIGS. 7A, 7B and 7C indicate frequency [MHz] while the vertical axes indicate power spectral density [dB]. The graphs are for a case without the predistorter 1 ("without predistorter"), a case with the predistorter 1 having a circuit of the third order ("O(3)") only and a case with the predistorter 1 having circuits of the third and fifth orders ("O(3, 5)").

FIG. 7B shows an example of a result of simulation where the predistorter 1 shown in FIG. 5C is used, the memory effect predistorter 2 is not provided and the memory effect of the amplifier is caused. As shown in the graph, the distortion can be compensated only by about 5 dB due to the influence of the memory effect.

FIG. 7C shows an example of a result of simulation where the predistorter 1 shown in FIG. 5C and the memory effect predistorter 2 shown in FIG. 2 are used, and the memory effect of the amplifier is caused. For example, "O(3,5,7)E(2)" refers to the use of the third order (O3), fifth order (O5) and seventh order (O7) of the predistorter 1 and the third order of the memory effect predistorter 2 (E2). This is true for others. As shown in the graph, the distortion can be compensated by about 20 dB or more due to the effect of the memory effect predistorter 2. For example, when the predistorter 1 handles up to the seventh order (O(3,5,7)) and the memory effect predistorter 2 handles up to the fifth order (E(2,4)), distortion can be compensated by −60 dB, which is preferable.

Here, in the example, a non-linear distortion component compensating unit is provided by the function of the predistorter 1.

For example, in the construction shown in FIGS. 5A to 5C, an even power raising unit is provided by the function of the square law detector 71 and/or the function of the fourth-power law detector 74. A unit for multiplying even power raising results is provided by the function of the multiplier 72 and/or the function of the multiplier 75. A distortion compensation coefficient multiplying unit is provided by the function of the multiplier 73 and/or the function of the multiplier 76. A unit for adding results of the multiplication of distortion compensation coefficients is provided by the function of the adder 77.

In these examples, a unit for compensating for a distortion component due to the memory effect is provided by the function of the memory effect predistorter 2.

For example, in the construction shown in FIG. 2, an even-power raising unit is provided by the function of the square-law detector 11 and/or the function of the fourth-power law detector 16. A unit for delaying the result of even-power raising is provided by the function of the delay circuit 12 and/or the function of the delay circuit 17. A unit for detecting a time difference between results of even-power raising is provided by the function of the subtractor 13 and/or the function of the subtractor 18. A unit for multiplying input signals is provided by the function of the multiplier 14 and/or the function of the multiplier 19. A unit for multiplying distortion compensation coefficients is provided by the function of the multiplier 15 and/or the function of the multiplier 20. A unit for adding results of multiplication of distortion compensation coefficients is provided by the function of the adder 21.

Figure 4:
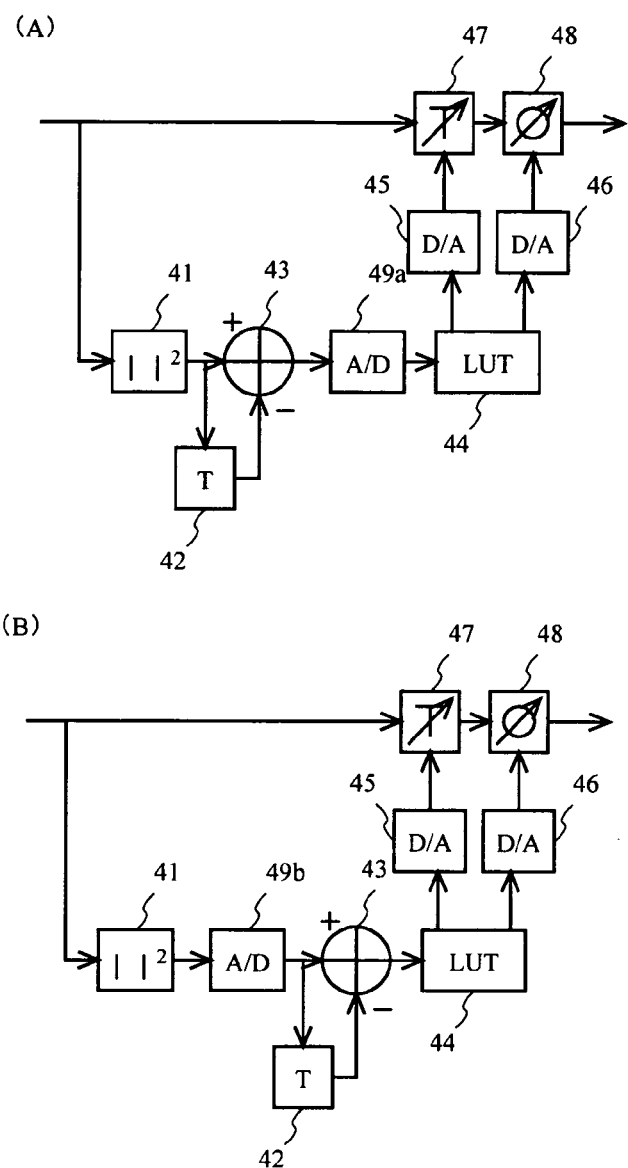
FIGS. 4A and 4B are diagrams each showing a configuration example of a memory effect predistorter according to a third embodiment of the invention.

As another example, in the constructions shown in FIGS. 3 to 4B, an even power raising unit is provided by the functions of the square law detectors 31 and/or 41. A unit for delaying results of even power raising is provided by the functions of the delay circuits 32 and/or 42. A unit for detecting a time difference between results of even-power raising is provided by the functions of the subtractors 33 and/or 43. A unit for storing time differences among results of even-power raising in accordance with control values is provided by the functions of the look-up tables (LUT) 34 and/or 44. In the construction shown in FIG. 3, a unit for changing an input signal (multiplying unit) is provided by the function of the multiplier 35. In the construction shown in FIGS. 4A and 4B, a unit for changing an input signal (unit for changing an amplitude and phase of an input signal) is provided by the function of the voltage adjustable attenuator 47 and the function of the voltage adjustable phase shifter 48.

What is claimed is:

1. A distortion-compensated amplifier for compensating for distortion, the distortion-compensated amplifier comprising:
   an amplifying section; and
   memory effect distortion component compensating means for compensating for a distortion component caused by a memory effect of the amplifying section by using a time difference of results from squaring an input signal and a time difference of results from raising the input signal to any other even power.

2. A distortion-compensated amplifier according to claim 1, wherein the memory effect distortion component compensating means includes:
   even power raising means for raising the input signal to an even power;
   even power raising result delaying means for delaying a signal of a result of the even power raising by the even power raising means;
   even power raising result time difference detecting means for detecting a difference between the signal of the result of the even power raising by the even power raising means and a delayed signal by the even power raising result delaying means;
   input signal multiplying means for multiplying a signal of a detection result by the even power raising result time difference detecting means by the input signal;
   distortion compensation coefficient multiplying means for multiplying a signal of a multiplication result by the input signal multiplying means by a distortion compensation coefficient; and
   distortion compensation coefficient multiplication result adding means for adding the input signal and a signal of a multiplication result by the distortion compensation coefficient multiplying means.

3. A distortion-compensated amplifier according to claim 1, further comprising:
   nonlinear distortion component compensating means for compensating for a distortion component caused by a nonlinear characteristic of an AM—AM characteristic and an AM-PM characteristic of the amplifying section, wherein the nonlinear distortion component compensating means includes:
   even power raising means for raising an input signal of the nonlinear distortion component compensating means to an even power;
   even power raising result multiplying means for multiplying a signal of a result of the even power raising by the even power raising means by the input signal of the nonlinear distortion component compensating means;
   distortion compensation coefficient multiplying means for multiplying a signal of a multiplication result by the even power raising result multiplying means by a distortion compensation coefficient; and
   distortion compensation coefficient multiplication result adding means for adding the input signal of the nonlinear distortion component compensating means and a signal of a multiplication result by the distortion compensation coefficient multiplying means.

4. A distortion-compensated amplifier according to claim 1, further comprising:
   nonlinear distortion component compensating means for compensating for a distortion component caused by nonlinearity of an AM—AM characteristic and an AM-PM characteristic of the amplifying section, wherein the nonlinear distortion component compensating means includes:
   envelop detecting means for detecting envelop voltage or envelope power of an input signal of the nonlinear distortion component compensating means;
   envelop-to-distortion-compensation-coefficient correspondence storage means for storing a correspondence between envelop voltage or envelop power and a distortion compensation coefficient; and
   input signal distortion compensation coefficient multiplying means for multiplying a distortion compensation coefficient corresponding to a value detected by the envelope detecting means based on data stored in the envelope-to-distortion-compensation-coefficient corresponding storage means by the input signal of the nonlinear distortion component compensating means.

5. A distortion-compensated amplifier according to claim 1, further comprising:
   nonlinear distortion component compensating means for compensating for a distortion component caused by nonlinearity of an AM—AM characteristic and AM-PM characteristic of the amplifying in section, wherein the nonlinear distortion component compensating means includes:

envelop detecting means for detecting envelop voltage or an envelope power of an input signal of the nonlinear distortion component compensating means;

envelop-to-control-value correspondence storage means for storing a correspondence between envelop voltage or envelop power and a control value; and input signal changing means for changing the input signal of the nonlinear distortion component compensating means in accordance with a control value corresponding to a value detected by the envelope detecting means based on data stored in the envelope-to-control-value correspondence storage means.

6. A distortion-compensated amplifier according to claim 1, wherein the memory effect distortion component compensating means includes:

even power raising means for raising the input signal to an even power;

even power raising result delaying means for delaying a signal of a result of the even power raising by the even power raising means;

even power raising result time difference detecting means for detecting a difference between the signal of the result of the even power raising by the even power raising means and a delayed signal by the even power raising result delaying means;

even-power-raising-result-time-difference-to-control-value correspondence storage means for storing a correspondence between a value detected by the even power raising result time difference detecting means and a control value; and input signal changing means for changing the input signal in accordance with a control value corresponding to the value detected by the even power raising result time difference detecting means based on data stored in the even-power-raising-result-time-difference-to-control-value correspondence storage means.

7. A distortion-compensated amplifier according to claim 6,
wherein the input signal changing means is multiplying means for multiplying a control signal by the input signal.

8. A distortion-compensated amplifier according to claim 6,
wherein the input signal changing means is input signal amplitude/phase changing means for changing one or both of an amplitude and a phase of the input signal based on the control value.

9. A distortion-compensated amplifier according to claim 3, the amplifier further comprising:
a control portion for performing feedback processing and processing based on a level of an input signal of the control portion in relation to distortion compensating processing by the nonlinear distortion component compensating means and distortion compensating processing by the memory effect distortion component compensating means.

10. A distortion-compensated amplifier according to claim 4, further comprising:
a control portion for performing feedback processing and processing based on a level of an input signal of the control portion in relation to distortion compensating processing by the nonlinear distortion component compensating means and distortion compensating processing by the memory effect distortion component compensating means.

11. A distortion-compensated amplifier according to claim 5, further comprising:
a control portion for performing feedback processing and processing based on a level of an input signal of the control portion in relation to distortion compensating processing by the nonlinear distortion component compensating means and distortion compensating processing by the memory effect distortion component compensating means.

12. A distortion-compensated amplifier using predistortion technique according to claim 3, further comprising:
a control portion for performing updating and converging parameters of distortion compensating processing by the nonlinear distortion component compensating means and updating and converging parameters of distortion compensating processing by the memory effect distortion component compensating means, and alternately and repeatedly performing the updating and converging of the parameters of distortion compensating processing by the nonlinear distortion component compensating means and the updating and converging the parameters of distortion compensating processing by the memory effect distortion component compensating means.

13. A distortion-compensated amplifier according to claim 4, further comprising:
a control portion for performing updating and converging parameters of distortion compensating processing by the nonlinear distortion component compensating means and updating and converging parameters of distortion compensating processing by the memory effect distortion component compensating means, and alternately and repeatedly performing the updating and converging of the parameters of distortion compensating processing by the nonlinear distortion component compensating means and the updating and converging of the parameters of distortion compensating processing by the memory effect distortion component compensating means.

14. A distortion-compensated amplifier according to claim 5, the amplifier further comprising:
a control portion for performing updating and converging parameters of distortion compensating processing by the nonlinear distortion component compensating means and updating and converging parameters of distortion compensating processing by the memory effect distortion component compensating means, and alternately and repeatedly performing the updating and converging of the parameters of distortion compensating processing by the nonlinear distortion component compensating means and the updating and converging of the parameters of distortion compensating processing by the memory effect distortion component compensating means.

15. A base station apparatus comprising a distortion-compensated amplifier for compensating for distortion, the distortion-compensated amplifier including:
an amplifying section; and
memory effect distortion component compensating means for compensating for a distortion component caused by a memory effect of the amplifying section by using a time difference of results from squaring the input signal and a time difference of results from raising the input power to any other even power.

16. A base station apparatus according to claim 15, wherein the memory effect distortion component compensating means includes:

even power raising means for raising the input signal to an even power;

even power raising result delaying means for delaying a signal of a result of the even power raising by the even power raising means;

even power raising result time difference detecting means for detecting a difference between the signal of the result of the even power raising by the even power raising means and a delayed signal by the even power raising result delaying means;

input signal multiplying means for multiplying a signal of a detection result by the even power raising result time difference detecting means by the input signal;

distortion compensation coefficient multiplying means for multiplying a signal of a multiplication result by the input signal multiplying means by a distortion compensation coefficient; and distortion compensation coefficient multiplication result adding means for adding the input signal and a signal of a multiplication result by the distortion compensation coefficient multiplying means.

17. A base station apparatus according to claim 15, wherein the distortion-compensated amplifier further includes:

nonlinear distortion component compensating means for compensating for a distortion component caused by nonlinearity of an AM—AM characteristic and an AM-PM characteristic of the amplifying section, and wherein the nonlinear distortion component compensating means includes:

even power raising means for raising an input signal of the nonlinear distortion component compensating means to an even power;

even power raising result multiplying means for multiplying a signal of a result of the even power raising by the even power raising means by the input signal of the nonlinear distortion component compensating means;

distortion compensation coefficient multiplying means for multiplying a signal of a multiplication result by the even power raising result multiplying means by a distortion compensation coefficient; and distortion compensation coefficient multiplication result adding means for adding the input signal of the nonlinear distortion component compensating means and a signal of a multiplication result by the distortion compensation coefficient multiplying means.

18. A base station apparatus according to claim 15, wherein the distortion-compensated amplifier further includes:

nonlinear distortion component compensating means for compensating for a distortion component caused by nonlinearity of an AM—AM characteristic and an AM-PM characteristic of the amplifying section, and wherein the nonlinear distortion component compensating means includes:

envelop detecting means for detecting envelop voltage or envelope power of an input signal of the nonlinear distortion component compensating means;

envelop-to-distortion-compensation-coefficient correspondence storage means for storing a correspondence between envelop voltage or envelop power and a distortion compensation coefficient; and input signal distortion compensation coefficient multiplying means for multiplying a distortion compensation coefficient corresponding to a value detected by the envelope detecting means based on data stored in the envelope-to-distortion-compensation-coefficient correspondence storage means by the input signal of the nonlinear distortion component compensating means.

19. A base station apparatus according to claim 15, wherein the distortion-compensated amplifier further includes:

nonlinear distortion component compensating means for compensating for a distortion component caused by nonlinearity of an AM—AM characteristic and an AM-PM characteristic of the amplifying section; and wherein the nonlinear distortion component compensating means includes:

envelop detecting means for detecting envelop voltage or envelope power of an input signal of the nonlinear distortion component compensating means;

envelop-to-control-value correspondence storage means for storing a correspondence between envelop voltage or envelop power and a control value; and input signal changing means for changing the input signal of the nonlinear distortion component compensating means in accordance with a control value corresponding to a value detected by the envelope detecting means based on data stored in the envelope-to-control-value correspondence storage means.

20. A transmitter comprising a distortion-compensated amplifier for compensating for distortion, the distortion-compensated amplifier including:

an amplifying section; and memory effect distortion component compensating means for compensating for a distortion component caused by a memory effect of the amplifying by using a time difference of results from squaring the input signal and a time difference of results for raising the input signal to any other even power.

* * * * *